United States Patent
Choe et al.

(10) Patent No.: US 7,718,231 B2
(45) Date of Patent: *May 18, 2010

(54) THIN BURIED OXIDES BY LOW-DOSE OXYGEN IMPLANTATION INTO MODIFIED SILICON

(75) Inventors: Kwang Su Choe, Sungnam-Shi (KR); Keith E. Fogel, Mohegan Lake, NY (US); Siegfried L. Maurer, Stormville, NY (US); Ryan M. Mitchell, Clintondale, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 1172 days.

This patent is subject to a terminal disclaimer.

(21) Appl. No.: 10/674,647

(22) Filed: Sep. 30, 2003

(65) Prior Publication Data
US 2005/0067055 A1    Mar. 31, 2005

(51) Int. Cl.
*C23C 14/10* (2006.01)
*C23C 14/48* (2006.01)
*C23C 14/58* (2006.01)
*H01L 21/762* (2006.01)

(52) U.S. Cl. .............. 427/526; 427/527; 438/766; 438/769; 438/771; 438/762; 438/378; 438/440; 438/441

(58) Field of Classification Search ............. None
See application file for complete search history.

(56) References Cited

U.S. PATENT DOCUMENTS

| | | | | |
|---|---|---|---|---|
| 5,854,123 A | * | 12/1998 | Sato et al. | 438/507 |
| 5,930,643 A | * | 7/1999 | Sadana et al. | 438/407 |
| 6,204,546 B1 | * | 3/2001 | Roitman et al. | 257/506 |
| 6,222,253 B1 | * | 4/2001 | Sadana et al. | 257/617 |
| 6,288,390 B1 | * | 9/2001 | Siuzdak et al. | 250/288 |
| 6,486,037 B2 | * | 11/2002 | Norcott et al. | 438/406 |

(Continued)

FOREIGN PATENT DOCUMENTS

JP    9-64323    7/1997

(Continued)

OTHER PUBLICATIONS

Matsumura, et al., "Technological innovation in low-dose SIMOX wafers fabricated by an internal thermal oxidation (ITOX) process", 2002 Elsevier Science B.V., Microelectronic Engineering 66 (2003), pp. 400-414, all odd-numbered pages missing.

*Primary Examiner*—Marianne L Padgett
(74) *Attorney, Agent, or Firm*—Scully, Scott, Murphy & Presser, P.C.; Louis J. Percello, Esq.

(57) ABSTRACT

A method of fabricating silicon-on-insulators (SOIs) having a thin, but uniform buried oxide region beneath a Si-containing over-layer is provided. The SOI structures are fabricated by first modifying a surface of a Si-containing substrate to contain a large concentration of vacancies or voids. Next, a Si-containing layer is typically, but not always, formed atop the substrate and then oxygen ions are implanted into the structure utilizing a low-oxygen dose. The structure is then annealed to convert the implanted oxygen ions into a thin, but uniform thermal buried oxide region.

9 Claims, 6 Drawing Sheets

U.S. PATENT DOCUMENTS

| | | | |
|---|---|---|---|
| 6,800,518 B2 * | 10/2004 | Bendernagel et al. | 438/207 |
| 6,806,171 B1 * | 10/2004 | Ulyashin et al. | 438/492 |
| 7,479,437 B2 * | 1/2009 | Greene et al. | 438/303 |
| 2002/0086463 A1 | 7/2002 | Houston et al. | |
| 2004/0126985 A1 | 7/2004 | Bendernagel et al. | |
| 2007/0122956 A1 * | 5/2007 | Chidambarrao et al. | 438/197 |
| 2007/0164358 A1 * | 7/2007 | de Souza et al. | 257/347 |
| 2007/0215916 A1 * | 9/2007 | Minami et al. | 257/288 |
| 2008/0012114 A1 * | 1/2008 | Balucani | 257/690 |

FOREIGN PATENT DOCUMENTS

| | | |
|---|---|---|
| WO | WO 2005/034209 A2 | 4/2005 |

* cited by examiner

THIN BURIED OXIDES BY LOW-DOSE OXYGEN IMPLANTATION INTO MODIFIED SILICON

FIELD OF THE INVENTION

The present invention relates to a method of fabricating a semiconductor structure, and more particularly to a method of fabricating a silicon-on-insulator (SOI) having a thin, uniform buried oxide, less than 100 nm in thickness, that is formed by using low-dose oxygen implantation.

BACKGROUND OF THE INVENTION

Silicon-on-insulator (SOI) structures are used in microelectronic device applications where the electrical and electronic interactions between the active device region and the underlying semiconductor structure are strongly discouraged. In a typical SOI structure, the buried oxide layer separates the Si over-layer (i.e., the SOI or device layer) from the Si substrate.

In complementary metal oxide semiconductor (CMOS) devices built on SOI, for instance, performance characteristics are known to be greatly improved. Specifically CMOS devices built on SOI can exhibit less junction capacitance and leakage, greater resistance to ionizing radiation, immunity to latch-up, etc. However, forming SOI structures is no simple matter.

Even after decades of research and development only a few methods are proven to be commercially viable. In one, called BESOI (bond-and-etch-back SOI), two Si wafers are oxidized at the surface and the oxidized surfaces are bonded together and then one of the two bonded wafers is etched to provide a thin SOI device layer. In this prior art method and its variations, as the wafer surfaces are oxidized before bonding, the buried oxide can be made to have any desired thickness. However, impurities at the bonded interface and the difficulty in achieving a thin, uniform Si over-layer through the etch-back process are major drawbacks. The terms "Si over-layer" and "SOI layer" may be interchangeably used in this application.

In another well-known method, called SIMOX (separation by implantation of oxygen), a selected dose of oxygen ions is directly implanted into a Si wafer, and then the wafer is annealed in an oxygen ambient at a high temperature so that the implanted oxygen is converted into a continuous buried oxide layer. The thickness of the buried oxide layer in the SIMOX method is mostly dependent on the implanted oxygen dose and the thermal oxidation conditions. Moreover, in SIMOX, the Si over-layer is thinned to a desired thickness during the thermal oxidation, after which the surface oxide is stripped off.

When the peak concentration of the implanted oxygen is very low (on the order of about 1E22 atoms/cm$^3$ or less), however, the buried oxide typically becomes broken and discontinuous, as the growing oxide precipitates tend to ball up to minimize the surface energy. Such an SOI structure is shown, for example, in FIG. 1. In FIG. 1, reference numeral 100 denotes the Si-containing substrate layer, reference numeral 102 denotes the buried oxide and reference numeral 104 denotes the Si-containing over-layer of a prior art SOI structure. As such, it is generally very difficult to form a buried oxide layer thinner than 100 nm using conventional SIMOX processing.

In MOSFET device applications, the Si over-layer and the buried oxide underneath need to be made thinner as the device dimensions shrink, in order to better control short-channel effects. This means that the buried oxide in up coming generations of MOSFET devices needs to be far thinner than what the conventional SIMOX technology is capable of.

SUMMARY OF THE INVENTION

One object of the present invention is to provide a method of fabricating SOI structures with a very thin (less than 100 nm), but uniform buried oxide.

Another object of the present invention is to provide a method of fabricating SOI structures in which the processing time is reduced, yet the throughput is increased by reducing the oxygen implantation dose to a level below which is allowed for in a typical SIMOX process.

An even further object of the present invention is to provide a method of fabricating SOI structures where the defect level in the Si over-layer, i.e., the SOI layer, is reduced by reducing implantation damages and by reducing the stresses and strains from the expanding volume of the buried oxide.

These and other objects and advantages are achieved in the present invention by utilizing a method wherein a low-dose oxygen implantation step is performed. By "low-dose", it is meant an oxygen dose of about 1E17 atoms/cm$^2$ or less. In prior art SIMOX processes, a low-dose oxygen implantation would usually result in a layer of broken and discontinuous buried oxides as the oxide tends to ball up to minimize surface energy. In the present invention, the problem is solved by forming a large number of vacancies or voids in a Si-containing substrate prior to the low-dose oxygen implantation step.

The vacancies or voids coalesce during the subsequent high-temperature oxidation and provide room for the buried oxide to expand laterally, resulting in a thin, uniform buried oxide layer. The term "uniform" is used in the present invention to denote a buried oxide region having a continuous interface with the Si-containing over-layer as well as the underlying Si-containing substrate wherein the variation of thickness across the entire wafer is less than 30% of the total thickness of the buried oxide layer. With a sufficient density of vacancies or voids, the thickness of the buried oxide layer is mostly dependent on the implanted dose and the internal thermal oxidation conditions. In one embodiment of the present invention, the vacancies or voids are formed into a Si-containing substrate by utilizing an electrolytic anodization process wherein a HF-containing solution is used.

In accordance with the method of the present invention, the SOI structure is fabricated by modifying a surface of a Si-containing substrate to contain a large concentration (on the order of about 0.01% or greater) of vacancies or voids. The terms "vacancies" and "voids" are interchangeably used in the present invention to denote a porous Si region. Next, a Si-containing layer is typically, but not always, formed atop the substrate and then oxygen ions are implanted into the structure utilizing a low-oxygen dose. The structure is then annealed to convert the implanted oxygen ions into a thin, but uniform thermal buried oxide region.

In broad terms, the method of the present invention comprises the steps of:

providing a structure comprising at least a Si-containing substrate that has a region of vacancies or voids located therein;

optionally forming a single crystal Si-containing layer atop said structure;

implanting oxygen ions into said structure using an oxygen dose of about 1E17 atoms/cm$^2$ or less; and annealing the structure containing implanted oxygen ions and vacancies or voids to form a silicon-on-insulator that includes a Si-containing over-layer and a buried oxide, said buried oxide having a thickness of about 100 nm or less.

In some embodiments of the present invention, a bake step conducted in a hydrogen-containing ambient is employed prior to the optional forming a single crystal Si-containing layer over the porous structure or prior to the implanting step.

In yet another embodiment of the present invention, a baking step performed in a hydrogen-containing atmosphere is employed to the SOI structure which includes the thin buried oxide layer.

The SOI structure obtained from the present invention contains a very thin, yet uniform and continuous buried oxide region.

DETAILED DESCRIPTION OF THE INVENTION

Figure 1:
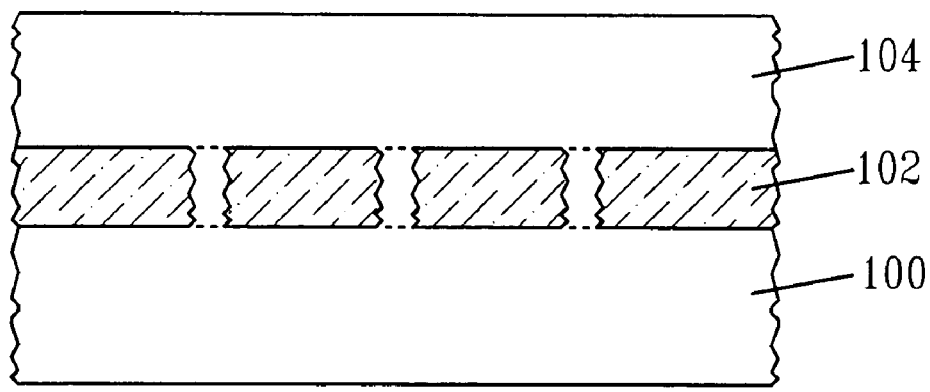
FIG. 1 is a pictorial representation (through a cross sectional view) of a prior art SOI structure made from a conventional SIMOX process using a low-dose oxygen implantation step.

The present invention, which provides a simple and low-cost method for forming an SOI substrate having a thin, uniform buried oxide region underlying a Si-containing over-layer, will now be described in greater detail by referring to the drawings that accompany the present application. In the accompanying drawings, like and/or corresponding elements are referred to by like reference numerals.

Figure 2A:
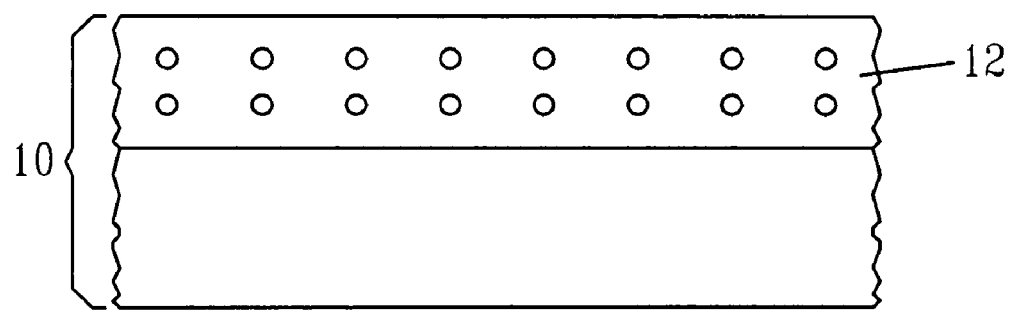
FIGS. 2A-2H are pictorial representations (through cross sectional views) illustrating the basic processing steps of the present invention.

Reference is first made to the initial structure shown in FIG. 2A, which includes a Si-containing substrate 10 having a region 12 of vacancies or voids formed therein. The terms "vacancies" and "voids" are interchangeable used in the present invention to denote a porous Si-containing region. The term "Si-containing" as used herein denotes a semiconductor material that includes at least silicon. Illustrative examples of such Si-containing materials include, but are not limited to: Si, SiGe, SiC, SiGeC, epi-Si/Si, epi-Si/SiC, epi-Si/SiGe, and preformed silicon-on-insulators (SOIs) or SiGe-on-insulators (SGOIs) which may include any number of buried insulating (i.e., continuous, non-continuous or a combination of continuous and non-continuous) regions formed therein.

The Si-containing substrate is a doped substrate that may contain a p- or n-type dopant, with p-type dopants being highly preferred. Doping is achieved either by growing doped Si ingots from which p- or n-doped wafers are cut and polished, or by ion implantation. Both of the aforementioned doping processes are well known to those skilled in the art. The concentration of dopants within the initial Si-containing substrate 10 may vary depending on the dopant used. For n-type dopants, the concentration of dopant being implanted is typically from about 1E17 to about 1E18 atoms/cm$^3$, whereas for p-type dopants, the concentration of dopant being implanted is typically from about 1E15 to about 2E19 atoms/cm$^3$.

Region 12 is formed near a surface region of the Si-containing substrate 10 using an electrolytic anodization process that is capable of forming a porous Si-containing region in the Si-containing substrate 10. The porous Si-containing region, i.e., region 12, includes vacancies or voids therein. The anodization process is performed by immersing the structure shown in FIG. 2A into an HF-containing solution while an electrical bias is applied to the structure with respect to an electrode also placed in the HF-containing solution. In such a process, the p-type structure typically serves as the positive electrode of the electrochemical cell, while another semiconducting material such as Si, or a metal is employed as the negative electrode.

In general, the HF anodization converts doped single crystal Si into porous Si. The rate of formation and the nature of the porous Si so-formed (porosity and microstructure) is determined by both the material properties, i.e., doping type and concentration, as well as the reaction conditions of the anodization process itself (current density, bias, illumination and additives in the HF-containing solution). Specifically, the porous Si forms with greatly increased efficiency in the higher doped regions.

Generally, the porous Si-containing region 12 formed in the present invention has a porosity of about 0.01% or higher. The depth of the porous Si-containing region 12 is typically from about 1000 nm or less, as measured from the upper most surface layer of the Si-containing substrate 10.

The term "HF-containing solution" includes concentrated HF (49%), concentrated HF with acetic acid, a mixture of HF and water, a mixture of HF and a monohydric alcohol such as methanol, ethanol, propanol, etc, or HF mixed with at least one surfactant. The amount of surfactant that is present in the HF solution is typically from about 1 to about 50%, based on 49% HF.

The anodization process, which converts a near surface portion of the Si-containing substrate 10 into a porous Si-containing region 12 using a constant current source that operates at a current density of from about 0.05 to about 50 milliAmps/cm$^2$. A light source may be optionally used to illuminate the sample. More preferably, the anodization process of the present invention is employed using a constant current source operating at a current density of from about 0.1 to about 5 milliAmps/cm$^2$.

The anodization process is typically performed at room temperature or at a temperature that is elevated from room temperature may be used. Following the anodization process, the structure is typically rinsed with deionized water and dried.

In an optional embodiment of the present invention, the structure shown in FIG. 2A may be baked in a hydrogen-containing ambient at atmospheric or a reduced pressure at this point of the present invention. When performed, this optional embodiment desorbs impurity atoms from the porous Si-containing region 12 (i.e., region containing vacancies and voids), while at the same time closing up any surface pores. The bake in a hydrogen-containing ambient is performed at a temperature from about 800° to about 1200° C., with a temperature from about 1000° to about 1150° C. being more highly preferred. Examples of hydrogen-containing ambients include $H_2$, $NH_4$, or mixtures thereof, including mixtures with, or without, an inert gas.

Figure 2B:
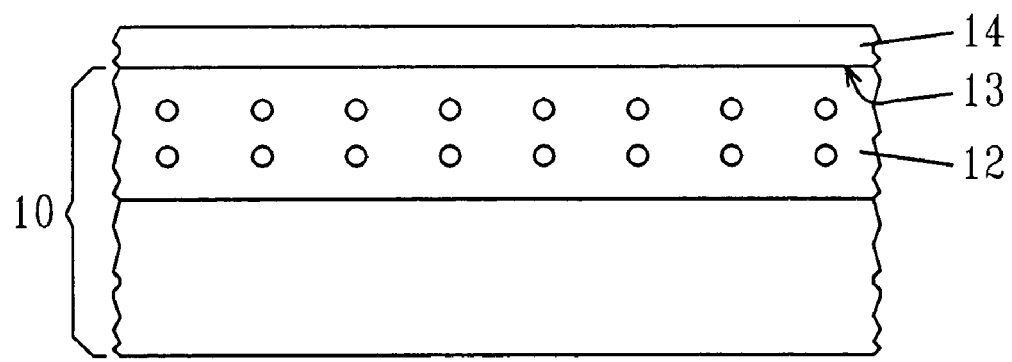

Next, a single crystal Si-containing layer 14 is typically, but not always, formed atop the Si-containing substrate 10 containing the porous Si-containing region 12 at this point of the present invention. The single crystal Si-containing layer 14 may not be needed when the porous Si-containing region 12 is formed some distance, 50 nm or greater, below the surface of the Si-containing substrate 10. The structure including the single crystal Si-containing layer 14 is shown, for example, in FIG. 2B; reference numeral 13 denotes the interface between the porous Si-containing region 12 and the single crystal Si-containing layer 14. The single crystal Si-containing layer 14 employed in the present invention comprises any Si-containing material including, for example, epitaxial Si (epi-Si), amorphous Si (a:Si), SiGe, single or polycrystalline Si or any combination thereof. Of the various Si materials listed above, it is preferred that epi-Si or epi-SiGe be employed as the single crystal Si-containing layer 14.

The single crystal Si-containing layer 14 has a thickness of from about 1 to about 1000 nm, with a thickness of from about 1 to about 400 nm being more highly preferred. The single crystal Si-containing layer 14 is formed using known deposition processes including an epitaxial growth process.

Figure 2C:
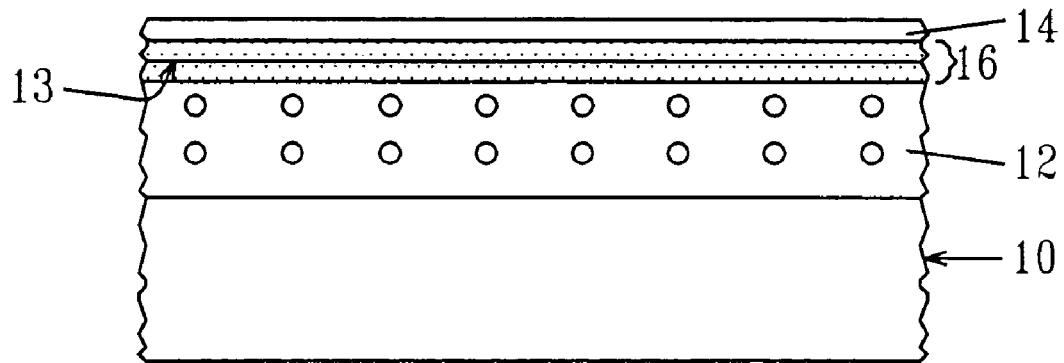
Figure 2D:
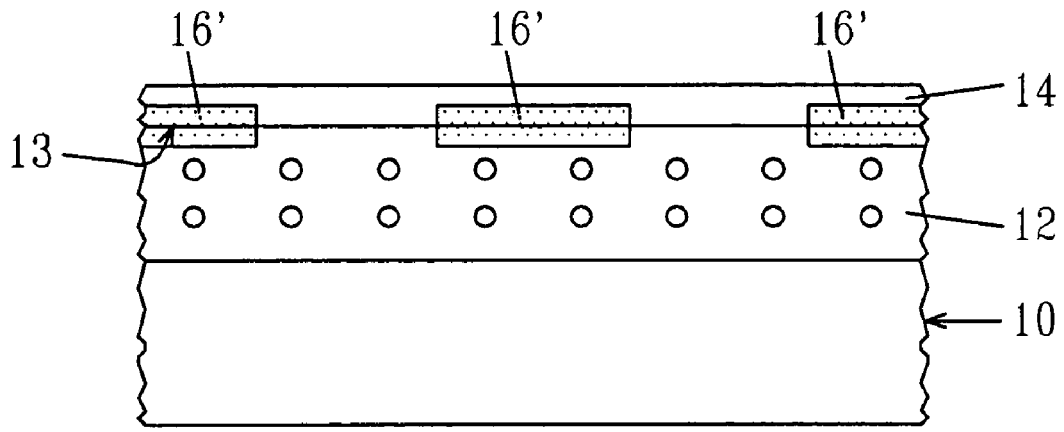

The structure including the thus formed porous Si-containing region 12, with the single crystal Si-containing layer 14 is then implanted with oxygen ions. The implant step may be a blanket implant in which oxygen ions are implanted across the entire wafer. This embodiment is depicted in FIG. 2C wherein region 16 denotes the oxygen implant region. The oxygen implant step may vary such that the oxygen peak is located at the Si-containing layer/porous Si interface or within the porous Si region (not shown). FIG. 2D depicts an embodiment in which a patterned oxygen ion implant step is performed forming patterned regions of implanted oxygen ions. Reference numeral 16' denotes the patterned regions of implanted oxygen ions.

The oxygen implant step is preformed using a low-dose implantation process. By "low-dose" it is meant an implant process in which the dose of oxygen ions being implanted into the Si-containing structures is about 1E17 atoms/cm$^2$ or less at greater than 200° C. More preferably, the oxygen implant step of the present invention is performed using a dose of oxygen ions from about 1E16 to about 5E16 atoms/cm$^2$. The implant may be performed in a continuous mode, or the implant may be performed using a pulse mode.

The low-dose oxygen ion implant step of the present invention is performed using a conventional implanter in which a beam current density from about 0.05 to about 500 milli-Amps/cm$^2$, with a beam current density from about 5 to about 50 milliAmps/cm$^2$ being more typical, is employed. The low-dose oxygen implant step of the present invention is typically performed at a temperature from about 200° to about 600° C. More typically, the temperature in which the implant is performed is from about 200° to about 400° C. The implant is performed at an energy from about 40 to about 1000 keV, with an energy from about 100 to about 200 keV being more typical.

In addition to the foregoing base oxygen implant step, an optional second oxygen implant step may be performed to enhance the uniformity of the buried oxide to be subsequently formed. The optional second oxygen implant step is performed at a dose of about 1E17 atoms/cm$^2$ or less. More preferably, the optional second oxygen implant step is performed using a dose of oxygen ions from about 1E14 to about 1E16 atoms/cm$^2$. The implant may be performed in a continuous mode, or the implant may be performed using a pulse mode.

The optional second oxygen ion implant step of the present invention is performed using a beam current density from about 0.05 to about 5 milliAmps/cm$^2$. The optional second oxygen implant step of the present invention is typically performed at a temperature from about 4K to about 200° C. More typically, the temperature in which the optional implant is performed is from about nominal room temperature to about 100° C. The optional implant step is performed at an energy from about 40 to about 1000 keV, with an energy from about 100 to about 200 keV being typical.

The low-dose oxygen implant step forms an oxygen implant region 16 that has a depth, as measured from the upper surface of the Si-containing substrate 10 of about 1500 nm or less. More preferably, the depth of the oxygen implant region 16 is from about 100 to about 500 nm. The depth of the oxygen implant region 16 should preferably be at the center or slightly below interface 13.

Figure 2E:
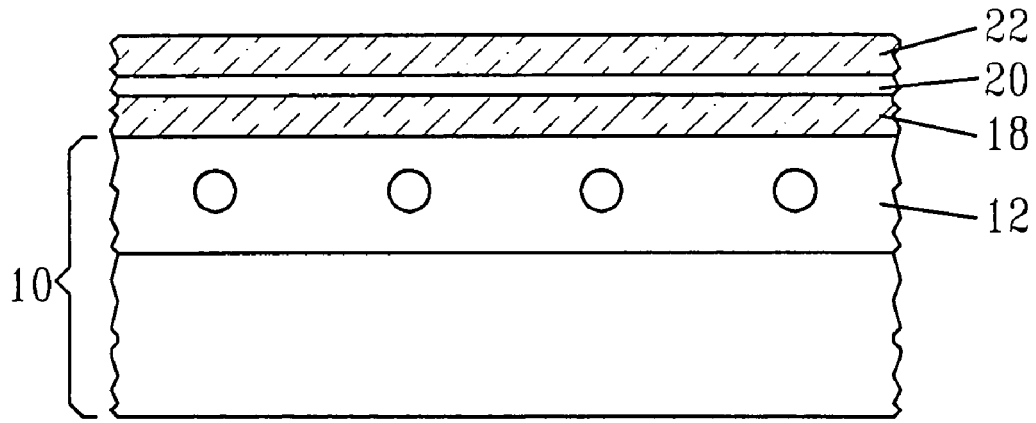
Figure 2F:
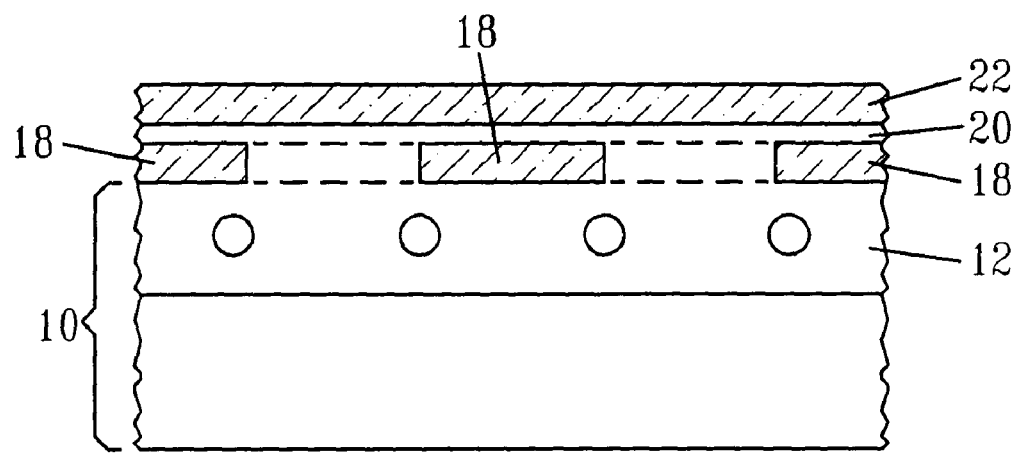

Subsequently, the structure shown in FIG. 2C or 2D is heated, i.e., annealed, using an oxidation process at a temperature at which the implant oxygen precipitates as oxides, and the precipitated oxides combine to form a thin, uniform buried oxide layer 18. A lot of the pores in the porous Si-containing region 12 are consumed during the thermal oxidation process and the remaining ones, if any, typically collapse into several large voids. In some embodiments in which the initial Si-containing substrate contains boron as a p-type dopant, the boron diffuses out from the starting substrate during this thermal oxidation step. The resultant structure including buried oxide region 18 and Si-containing over-layer 20, i.e., the SOI layer, is shown, for example, in FIGS. 2E and 2F.

Figure 2G:
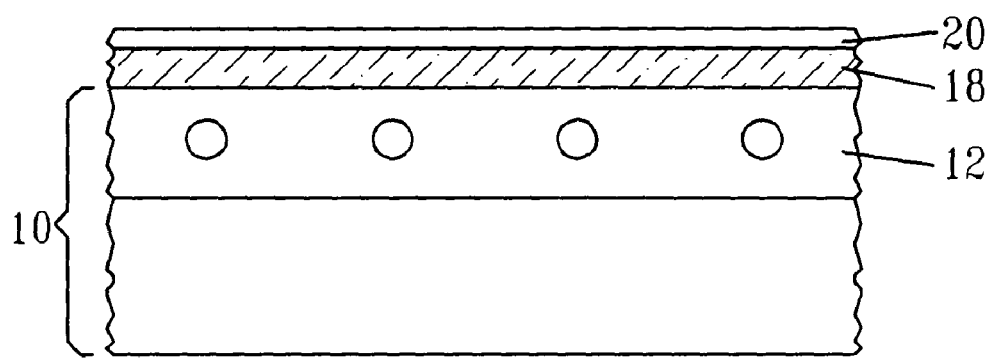
Figure 2H:
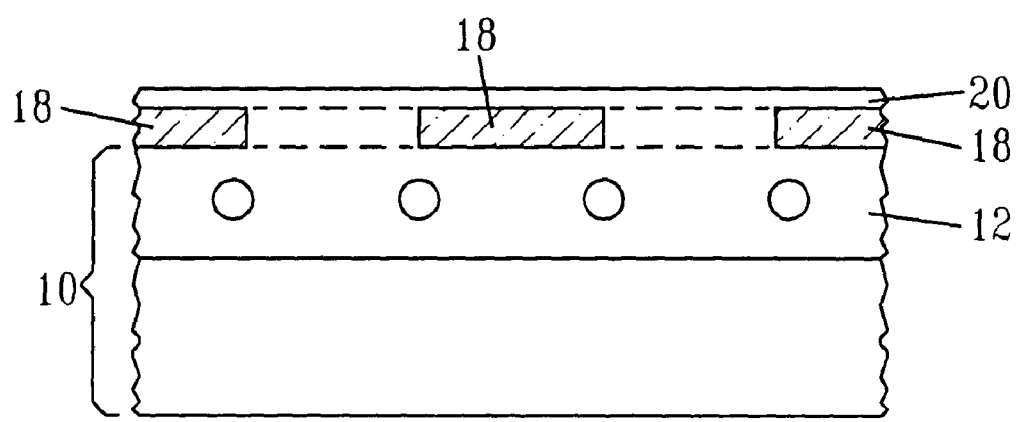

Note that an oxide layer 22 is formed atop the Si-containing over-layer 20 during the heating step. This surface oxide layer, i.e., oxide layer 22, is typically, but not always, removed from the structure after the heating step using a conventional wet etch process wherein a chemical etchant such as HF that has a high selectivity for removing oxide as compared to silicon is employed. FIG. 2G or 2H shows the structure after the surface oxide layer 22 has been removed.

The thickness of the buried oxide and the Si-containing over-layer can be controlled to desired values by adjusting the thermal oxidation conditions. The surface oxide layer 22 formed after the heating step of the present invention has a variable thickness which may range from about 10 to about 1000 nm, with a thickness of from about 20 to about 500 nm being more typical.

Specifically, the heating step of the present invention is a thermal oxidation process that is performed at a temperature from about 650° to about 1350° C., with a temperature from about 1200° to about 1325° C. being more highly preferred. Moreover, the heating step of the present invention is carried out in an oxidizing ambient which includes at least one oxygen-containing gas such as $O_2$, NO, $N_2O$, ozone, air and other like oxygen-containing gases. The oxygen-containing gas may be admixed with each other (such as an admixture of $O_2$ and NO), or the gas may be diluted with an inert gas such as He, Ar, $N_2$, Xe, Kr, or Ne. When a diluted ambient is employed, the diluted ambient contains from about 0.5 to about 100% of oxygen-containing gas, the remainder, up to 100%, being inert gas.

The heating step may be carried out for a variable period of time that typically ranges from about 10 to about 1800 minutes (at 1200° to about 1325° C.), with a time period from about 60 to about 600 minutes being more highly preferred. The heating step may be carried out at a single targeted temperature, or various ramp and soak cycles using various ramp rates and soak times can be employed.

In another embodiment of the present invention wherein excess dopant ions are implanted, a post oxidation thermal anneal in a hydrogen ambient can be used to reduce the level of dopants within the Si-containing over-layer. When such a post oxidation process is performed, the post oxidation thermal anneal in a hydrogen ambient is performed at a temperature from about 800° to about 1200°C., with a temperature from about 1000° to about 1150° C. being more highly preferred. Examples of hydrogen ambients include $H_2$, $NH_4$, and mixtures thereof, including mixtures with, or without, an inert gas. The concentration of dopant ions with the Si-containing over-layer may be reduced by more than two orders of magnitude using the aforementioned post oxidation thermal anneal.

In yet another embodiment of the present invention, the single crystal Si-containing layer is not formed atop the Si-containing substrate containing the porous Si region. In this embodiment, the oxygen ions are directly implanted into the porous Si-containing substrate. This substrate may, or may not have undergone a $H_2$ bake treatment. The resulting buried oxide would be still uniform, but somewhat thicker due to faster oxygen diffusion from the ambient to the buried oxide during thermal oxidation.

In accordance with the present invention, the Si-containing over-layer 20 has a thickness of about 1000 nm or less, with a thickness of from about 10 to about 800 nm being more highly preferred. Note that the Si-containing over-layer 20 formed in the present invention is a thin layer that is substantially defect free. The buried oxide layer 18 formed during the heating step has a thickness of about 5 nm to about 100 nm, with a thickness of from about 10 to about 80 nm being more highly preferred. The buried oxide layer 18 has a smooth and continuous interface with the Si-containing over-layer 20.

As stated above, the surface oxide layer 22 may be stripped at this point of the present invention so as to provide the Si-on-insulator substrate material shown, for example, in FIG. 2G or 2H.

Figure 3A:
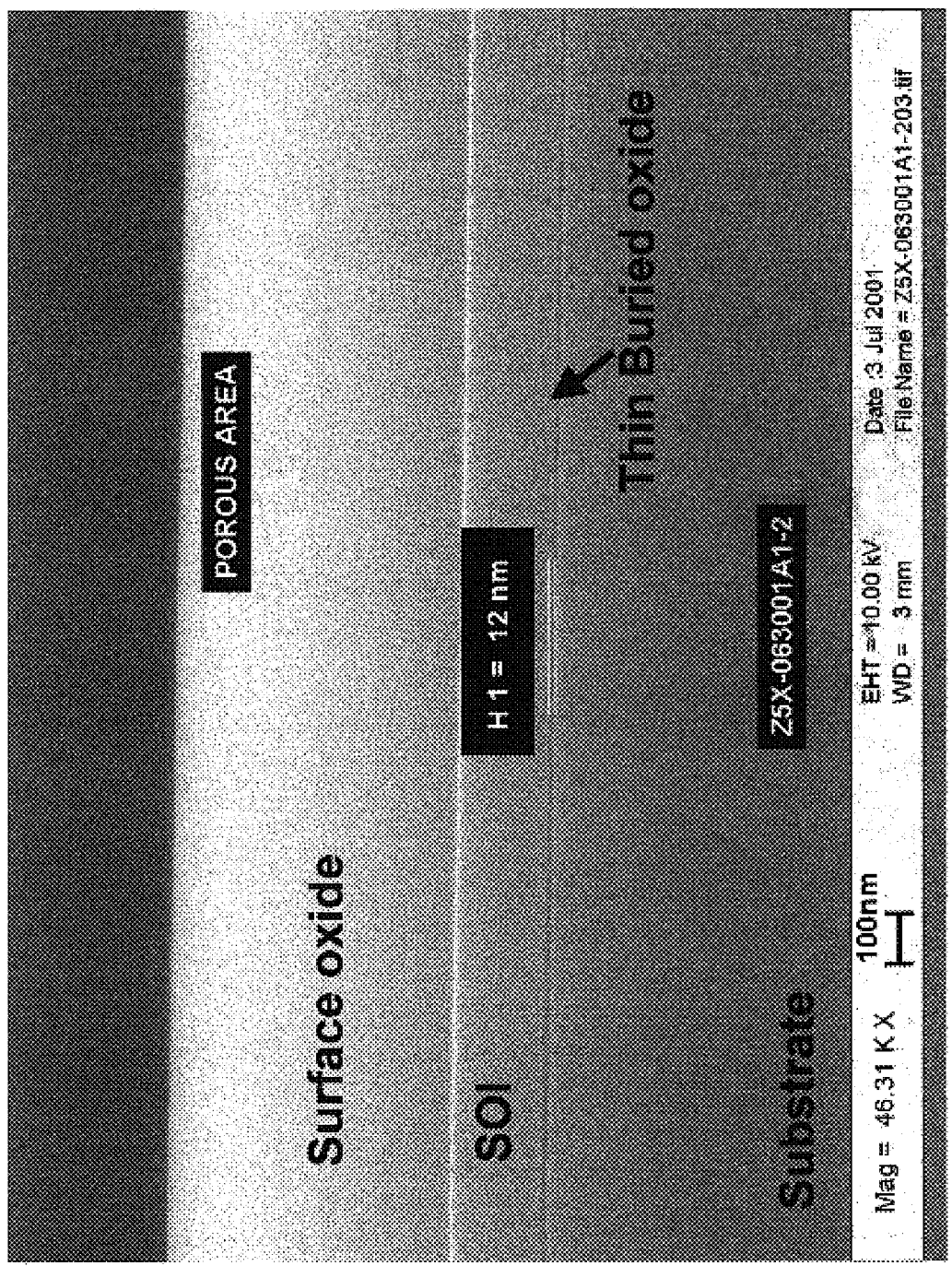
FIGS. 3A-3C are cross-sectional SEM images through various processing steps of the present invention.
Figure 3B:
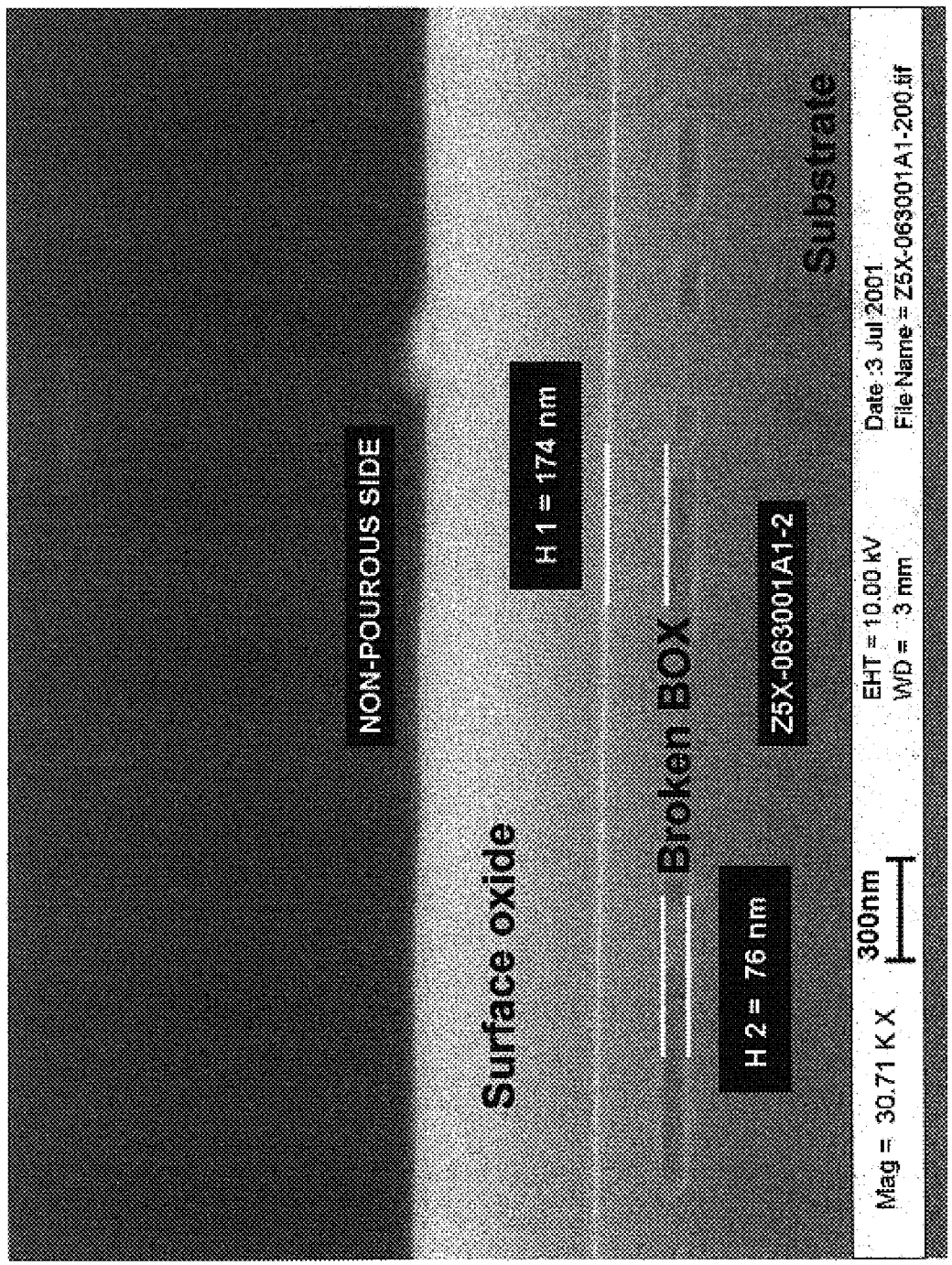

FIG. 3A is a cross-sectional SEM micrograph showing a buried oxide layer of approximately 12 nm thickness formed by the inventive method described here. The substrate process history was as follows:

Starting substrate: Boron-doped wafers with p-doping of 1E19 cm$^{-3}$
Porous-Si Formation: current, 0.5-1.0 mA, time: approximately 2 min
Epi-Si growth: 4000-5000 Å with a $H_2$ bake at 1150° C.
Oxygen implant @350° C.: 5E16 cm$^{-2}$
Oxygen implant @nominal room temperature: 2E15 cm$^{-2}$
High temperature anneal: 10 hrs @1325° C. with approximately 25% oxygen mixed with Ar+5 hrs @1325° C. with approximately 35% oxygen mixed with Ar Region A is the surface oxide grown during the anneal
Region B is the SOI layer
Region C is the thin buried oxide
Region D is the substrate FIG. 3B is a cross-sectional SEM micrograph showing a broken buried oxide layer of approximately 76 nm islands. This region of the same substrate as above did not receive any porous-Si treatment but did receive the same Si epi growth, oxygen implants and anneals as shown in FIG. 3A. This figure clearly demonstrates that the existence of a porous-Si is the center piece to create a thin and continuous buried oxide. The substrate history is described below.

Figure 3C:
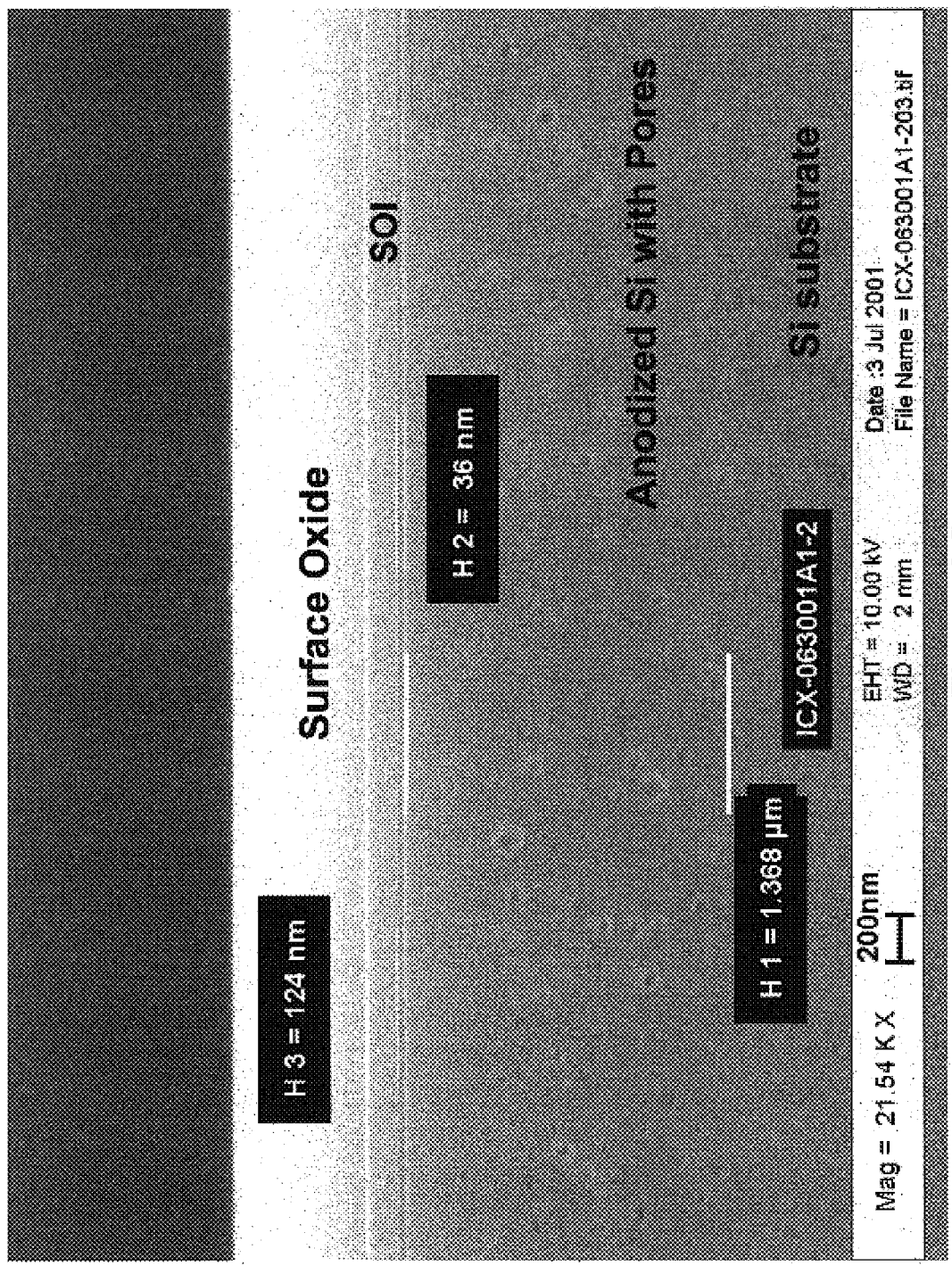

Starting substrate: Boron-doped wafers with p-doping of 1E19 cm$^{-3}$
Epi-Si growth: 4000-5000 Å with a $H_2$ bake at 1150° C.
Oxygen implant @350° C.: 5E16 cm$^{-2}$
Oxygen implant @nominal room temperature: 2E15 cm$^{-2}$
High temperature anneal: 10 hrs @1325° C. with approximately 25% oxygen mixed with Ar+5 hrs @1325° C. with approximately 35% oxygen mixed with Ar Region A is the surface oxide grown during the anneal
Region B is the SOI layer
Region C is that with broken buried oxide
Region D is the substrate FIG. 3C is a cross-sectional SEM micrograph showing how the buried oxide layer thickness can be controlled by the base oxygen implant dose. Buried oxide of approximately 36 nm was created by the inventive method described here. The substrate process history was as follows:

Starting substrate: Boron-doped wafers with p-doping of 1E19 cm$^{-3}$
Porous-Si Formation: current, 0.5-1.0 mA, time: approximately 2 min
Epi-Si growth: 4000-5000 Å with a $H_2$ bake at 1150° C.
Oxygen implant @350° C.: 1E17 cm$^{-2}$
Oxygen implant @nominal room temperature: 2E15 cm$^{-2}$
High temperature anneal: 10 hrs @1325° C. with approximately 25% oxygen mixed with Ar+5 hrs @1325° C. with approximately 35% oxygen mixed with Ar Region A is the surface oxide grown during the anneal
Region B is the SOI layer
Region C is the thin buried oxide
Region D is the substrate While the present invention has been particularly shown and described with respect to preferred embodiments thereof, it will be understood by those skilled in the art that the foregoing and other changes in forms and details may be made without departing from the scope and spirit of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A method of fabricating a substrate comprising:
    forming a porous Si-containing region via electrolytic anodization of a Si-containing region having n-type or p-type dopant in an upper portion of a Si-containing substrate;
    forming a single crystal Si-containing layer directly on top of said porous Si-containing region by epitaxial deposition;
    forming an oxygen implant region by implanting oxygen ions into the porous Si-containing region, wherein a peak oxygen content is provided by the implanting of the oxygen ions, and is located within said porous Si-containing region or at an interface between said single crystal Si-containing layer and said porous Si-containing region; and
    annealing using a thermal oxidation process at a temperature at which said implanted oxygen ions precipitate as oxides, wherein said precipitated oxides combine to form a uniform buried oxide layer extending across an entirety of a semiconductor-on-insulator (SOI) substrate, wherein after the annealing portions of the porous Si-containing region located beneath said uniform buried oxide layer now contain voids created by a collapse of previously existing pores in the porous Si-containing region, wherein a variation of thickness of said uniform buried oxide layer across said entirety of said Si-containing substrate is less than 30% of a total thickness of said uniform buried oxide layer, and wherein a Si-containing over-layer is formed from a remaining portion of said single crystal Si-containing layer.

2. The method of claim 1, further comprising annealing said silicon-on-insulator (SOI) substrate in a hydrogen containing ambient after said thermal oxidation process, wherein a level of dopant atoms in said Si-containing over-layer is reduced during said annealing in said hydrogen containing ambient.

3. The method of claim 1, wherein an oxygen dose of about 1E17 atoms/cm$^2$ or less is employed during said implanting of said oxygen atoms, and wherein said uniform buried oxide layer has a thickness of about 100 nm or less.

4. A method of fabricating a substrate comprising:

forming a porous Si-containing region via electrolytic anodization of a Si-containing region having n-type or p-type dopant in an upper portion of a Si-containing substrate;

forming a single crystal Si-containing layer directly on top of said porous Si-containing region by epitaxial deposition;

forming a plurality of patterned oxygen implant regions by implanting oxygen ions into least the porous Si-containing region, wherein a peak oxygen content is provided by the implanting of the oxygen ions, and is located within said porous Si-containing region or at an interface between said single crystal Si-containing layer and said porous Si-containing region; and annealing using a thermal oxidation process at a temperature at which said implanted oxygen ions precipitate as oxides, wherein said precipitated oxides combine to form a plurality of buried oxide islands, in which a variation in thickness of the buried oxide islands across an entire width of the buried oxide islands is less than 30% of a total thickness of the buried oxide islands, wherein after the annealing, portions of the porous Si-containing region located beneath said plurality of the buried oxide islands now contain voids created by a collapse of previously existing pores in the porous Si-containing region, wherein a Si-containing over-layer is formed from a remaining portion of said single crystal Si-containing layer, and wherein said porous Si-containing region abuts said single crystal Si-containing layer around said plurality of the buried oxide islands.

5. The method of claim 4, further comprising annealing said silicon-on-insulator structure in a hydrogen containing ambient after said thermal oxidation process, wherein a level of dopant atoms in said Si-containing over-layer is reduced during said annealing in said hydrogen containing ambient.

6. The method of claim 4, wherein an oxygen dose of about $1E17$ atoms/cm$^2$ or less is employed during said implanting of said oxygen atoms, and wherein said uniform buried oxide layer has a Thickness of about 100nm or less.

7. A method of fabricating a substrate comprising:

forming a porous Si-containing region via electrolytic anodization of a Si-containing region having n-type or p-type dopant in an upper portion of a Si-containing substrate;

forming a single crystal Si-containing layer directly on top of said porous Si-containing region by epitaxial deposition;

forming at least one oxygen implant region by implanting oxygen ions into at least the porous Si-containing region, wherein a peak oxygen content is provided by the implanting of the oxygen ions, and is within said porous Si-containing region or at an interface between said single crystal Si-containing layer and said porous Si-containing region; and annealing using a thermal oxidation process at a temperature at which said implanted oxygen ions precipitate as oxides, wherein said precipitated oxides combine to form a uniform buried oxide region during said annealing, wherein some pores in said porous Si-containing region collapse into voids beneath the uniform buried oxide regions during said annealing, wherein after the annealing, portions of the porous Si-containing region located beneath said uniform buried oxide layer now contain voids created by a collapse of previously existing pores in the porous Si-containing region, and wherein a Si-containing over-layer is formed from a remaining portion of said single crystal Si-containing layer to provide a semiconductor-on-insulator (SOI) substrate.

8. The method of claim 7, further comprising annealing said semiconductor-on-insulator (SOI) substrate in a hydrogen containing ambient after said thermal oxidation process, wherein a level of dopant atoms in said Si-containing over-layer is reduced during said annealing in said hydrogen containing ambient.

9. The method of claim 7, wherein an oxygen dose of about $1E17$ atoms/cm$^2$ or less is employed during said implanting of said oxygen atoms, and wherein said uniform buried oxide layer has a thickness of about 100 nm or less.

\* \* \* \* \*